US010847455B2

(12) United States Patent
Yin et al.

(10) Patent No.: US 10,847,455 B2
(45) Date of Patent: Nov. 24, 2020

(54) POWER MODULE AND POWER DEVICE

(71) Applicant: Delta Electronics (Shanghai) CO., LTD, Shanghai (CN)

(72) Inventors: Guodong Yin, Shanghai (CN); Jinfa Zhang, Shanghai (CN); Haijun Yang, Shanghai (CN); Ben Wu, Shanghai (CN); Lei Cai, Shanghai (CN); Zhongwei Ke, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 193 days.

(21) Appl. No.: 15/600,913

(22) Filed: May 22, 2017

(65) Prior Publication Data

US 2017/0345756 A1 Nov. 30, 2017

(30) Foreign Application Priority Data

May 25, 2016 (CN) .......................... 2016 1 0352569

(51) Int. Cl.
*H01F 17/04* (2006.01)
*H01L 23/522* (2006.01)
*H05K 1/16* (2006.01)
*H01F 27/28* (2006.01)
*H01L 23/528* (2006.01)
*H01L 23/64* (2006.01)
(Continued)

(52) U.S. Cl.
CPC ..... *H01L 23/5227* (2013.01); *H01F 27/2804* (2013.01); *H01L 23/5286* (2013.01);
(Continued)

(58) Field of Classification Search
USPC ................ 336/221, 213, 212, 182, 184, 188
See application file for complete search history.

(56) References Cited

U.S. PATENT DOCUMENTS

2002/0057158 A1* 5/2002 Matsumoto ........... H01F 27/027
336/83
2005/0110606 A1* 5/2005 Vinciarelli .......... H01F 27/2804
336/200
(Continued)

FOREIGN PATENT DOCUMENTS

CN 1099530 A 3/1995
CN 1615675 A 5/2005
(Continued)

OTHER PUBLICATIONS

The CN1OA issued by CNIPA dated Jan. 2, 2019.
The CNNOA issued Dec. 24, 2019 by the CNIPA.

*Primary Examiner* — Elvin G Enad
*Assistant Examiner* — Kazi S Hossain
(74) *Attorney, Agent, or Firm* — Yunling Ren

(57) ABSTRACT

A power module and a power device having the power module are disclosed. The power device includes a main board. The power module is inserted in the main board and includes a PCB, a magnetic element, a primary winding circuit and at least one secondary winding circuit. The magnetic element is provided on the PCB and includes a core structure, a primary winding and at least one secondary winding. The core structure has a first side and a second side opposite to each other, and a third side and a fourth side opposite to each other. The primary winding circuit is provided on the PCB and positioned in the vicinity of the first or second side of the core structure. The secondary winding circuit is provided on the PCB and positioned in the vicinity of the third or fourth side of the core structure.

16 Claims, 11 Drawing Sheets

(51) Int. Cl.
    *H05K 7/14*    (2006.01)
    *H05K 1/02*    (2006.01)
    *H01L 49/02*   (2006.01)

(52) U.S. Cl.
    CPC .......... *H01L 23/645* (2013.01); *H05K 1/165* (2013.01); *H05K 7/1457* (2013.01); *H01F 2027/2809* (2013.01); *H01F 2027/2819* (2013.01); *H01L 28/10* (2013.01); *H05K 1/0265* (2013.01); *H05K 2201/086* (2013.01); *H05K 2201/1003* (2013.01); *H05K 2201/1028* (2013.01); *H05K 2201/10287* (2013.01)

(56) References Cited

U.S. PATENT DOCUMENTS

2010/0141371 A1* 6/2010 Wang ................ H01F 17/0013
                                                    336/200
2012/0212314 A1* 8/2012 Li .................... H05K 7/1432
                                                    336/192
2013/0278373 A1* 10/2013 Hara ................. H01F 5/003
                                                    336/200
2015/0282370 A1* 10/2015 Yang ................ H05K 7/1432
                                                    361/736
2018/0040410 A1* 2/2018 Hamada ................ H01F 30/10

FOREIGN PATENT DOCUMENTS

| | | |
|---|---|---|
| CN | 201160024 Y | 12/2008 |
| CN | 201708703 U | 1/2011 |
| CN | 202142997 U | 2/2012 |
| CN | 203205229 U | 9/2013 |
| CN | 103348577 A | 10/2013 |
| CN | 103378748 A | 10/2013 |
| CN | 105099132 A | 11/2015 |
| JP | 2010193536 A | 9/2010 |
| JP | 201123633 A | 2/2011 |

* cited by examiner

POWER MODULE AND POWER DEVICE

CROSS REFERENCE

This application is based upon and claims priority to Chinese Patent Application No. 201610352569.3, filed on May 25, 2016, the entire contents thereof are incorporated herein by reference.

TECHNICAL FIELD

The present disclosure relates to a power module and a power device.

BACKGROUND

In the fields of server and telecom or the like, the conventional power device includes main board, at least one power module mounted on the main board and other functional components. Further, main power semiconductor devices are integrated in the power module. The design of the power module is particularly important for achieving high efficiency, high power density, high reliability and low cost.

FIG. 1a shows a structural block diagram of a conventional power module. The power module includes a primary winding circuit, a secondary winding circuit, and an isolation transformer between the primary winding circuit and the secondary winding circuit. FIG. 1b shows a schematic perspective diagram of a conventional power module. As shown in FIG. 1b, the conventional power module includes a PCB 31, an isolation transformer 32, a primary winding circuit 33 and a secondary winding circuit 34. The isolation transformer 32 is located in middle of the PCB 31, and the primary winding circuit 33 and the secondary winding circuit 34 are positioned on the PCB 31 and located on opposite sides of the isolation transformer 32.

In low-voltage and large-current applications, an architecture of a transformer that a plurality of primary windings connected in series and a plurality of secondary windings connected in parallel is generally employed in order to improve the power density and efficiency of the power device. Referring to a schematic circuit diagram of a conventional power module as shown in FIG. 1c. For a conventional power module constructed as the architecture of FIG. 1c, it is difficult to achieve a series connection or a parallel connection of two or more isolation transformers in a single power module, due to the arrangement of the primary winding and secondary winding of the transformer.

If it is desired to further increase the power, the only way for the conventional architecture of power module is to increase the number of layers of the PCB. However, when PCB layers increase, it will introduce a number of problems such as significant increase in PCB costs, heat-dissipation difficulty of the inner layer of the PCB windings, the increase in losses caused by current imbalance of the PCB layers, and so on. The isolation transformer blocks the normal air flow, and thus the primary winding circuit 33 or the secondary winding circuit 34 suffers from overheating, which results in low conversion efficiency of the power device. In addition, in the conventional power device, the electrical path between the secondary winding of the isolation transformer and the secondary winding circuit is long, and the connection line is relatively long. For example, the length of the connection line is up to 40 mm, thereby increasing line loss of the power device, which is not beneficial to improve the power density and efficiency of the power device.

The above information disclosed in the background technology section is only used to facilitate understanding the background of the present disclosure, and thus it may include information which does not construct the prior art well-known by the person skilled in the related art.

SUMMARY

According to an aspect of the present disclosure, a power module for use in a power device having a main board includes a printed circuit board (PCB), a magnetic element, a primary winding circuit and at least one secondary winding circuit. The magnetic element is disposed on the PCB Wherein the magnetic element includes a core structure, a primary winding and at least one secondary winding, and the core structure has a first side, a second side opposite to the first side, a third side and a fourth side opposite to the third side, and the third side and the fourth side contact with the first side and the second side, respectively. The primary winding circuit is disposed on the PCB and positioned in the vicinity of the first side or the second side of the core structure. The secondary winding circuit is disposed on the PCB and positioned in the vicinity of the third side or the fourth side of the core structure.

According to another aspect of the present disclosure, a power device includes a main board and at least one power module according to present disclosure, which is inserted in the main board, respectively.

The additional aspects and advantages of the present disclosure will be partly set forth in the following description, and partly become apparent from the description or learned from practice of the present disclosure.

BRIEF DESCRIPTION OF THE DRAWINGS

The above and other features and advantages of the present disclosure will become more apparent by describing exemplary embodiments thereof with reference to the attached drawings.

DETAILED DESCRIPTION

Figure 1A:
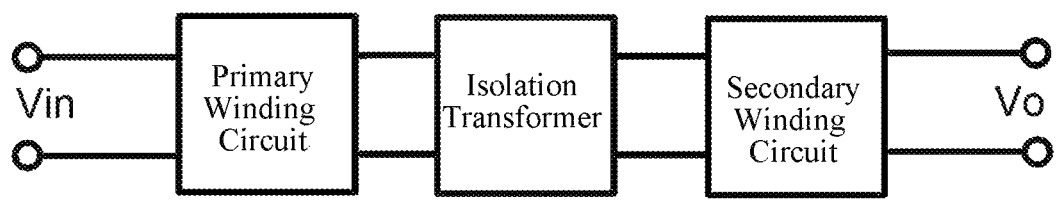
FIG. 1a shows a structural block diagram of a conventional power module.
Figure 1B:
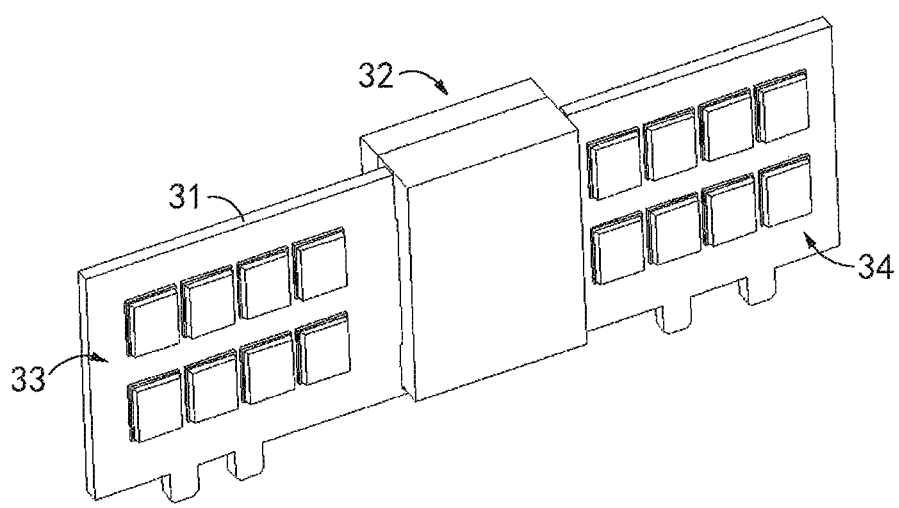
FIG. 1b shows a schematic perspective diagram of a conventional power module.
Figure 1C:
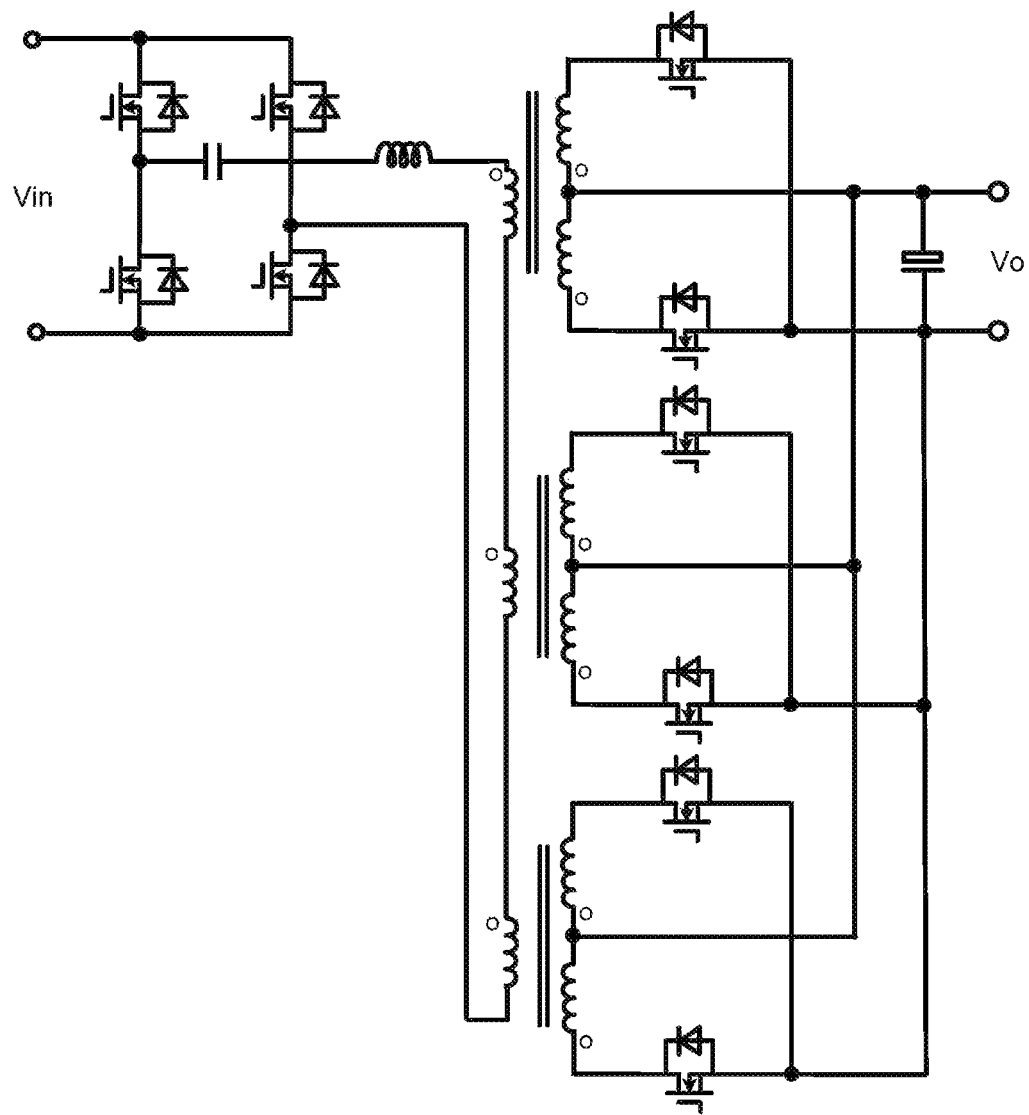
FIG. 1c shows a schematic circuit diagram of a conventional power module, in which a plurality of secondary winding circuits are connected in parallel.

Now, exemplary embodiments of the present disclosure will be more fully described with reference to the attached drawings. However, the exemplary embodiments can be implemented in various ways, and should not be construed as being limited to the embodiments set forth herein, rather, these embodiments are provided so that the present disclosure will be thorough and complete, and will fully convey the scope of the present disclosure to the person skilled in the related art. Throughout the drawings, the same reference numerals are used to refer to the same or similar structure, and thus its detail description will be omitted as necessary.

The terms "a", "an", "the", "said" and "at least one", when describing element/constituent/or the like as described and/or shown herein, are used to express the presence of one or more the element/constitute/or the like. The terms "include", "comprise" and "have", as used herein, are intended to be inclusive, and mean there may be additional elements/constituents/or the like other than the listed elements/constituents/or the like. The relativity words, such as "upper" or "lower", as used herein, are used to describe the relative relationship of the referenced component to another component. It is appreciated that if the referenced device is inversed upside down, the component indicated as being the "upper" side would become the component on the "lower" side. In addition, the words "first", "second", or the like, as used in claims, are meant to indication, but not to limit the object to which they modify.

The present disclosure provides a power module and a power device including the power module, which have better heat dissipation effect and reduced line losses of the secondary winding of the power module. The power density and efficiency of the power device may be significantly improved without increasing the number of layer of the PCB.

Power Module

Figure 2:
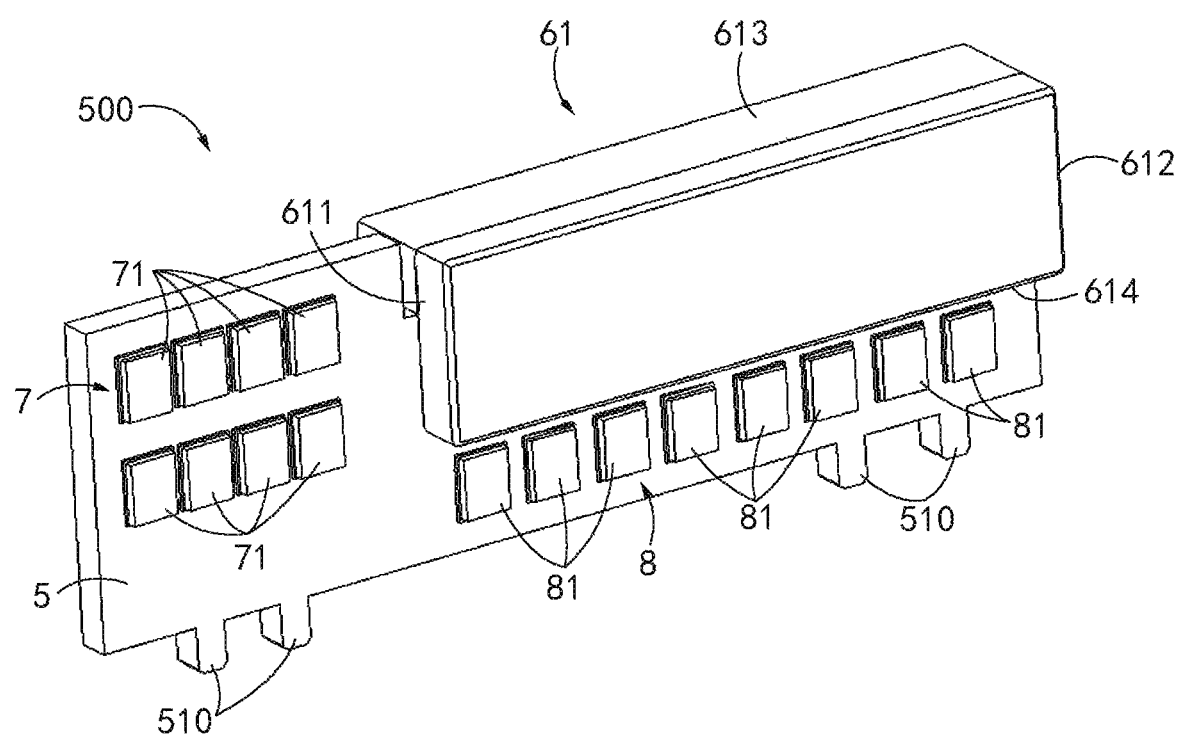
FIG. 2 is a schematic diagram of the power module according to an exemplary embodiment of the present disclosure.
Figure 3:
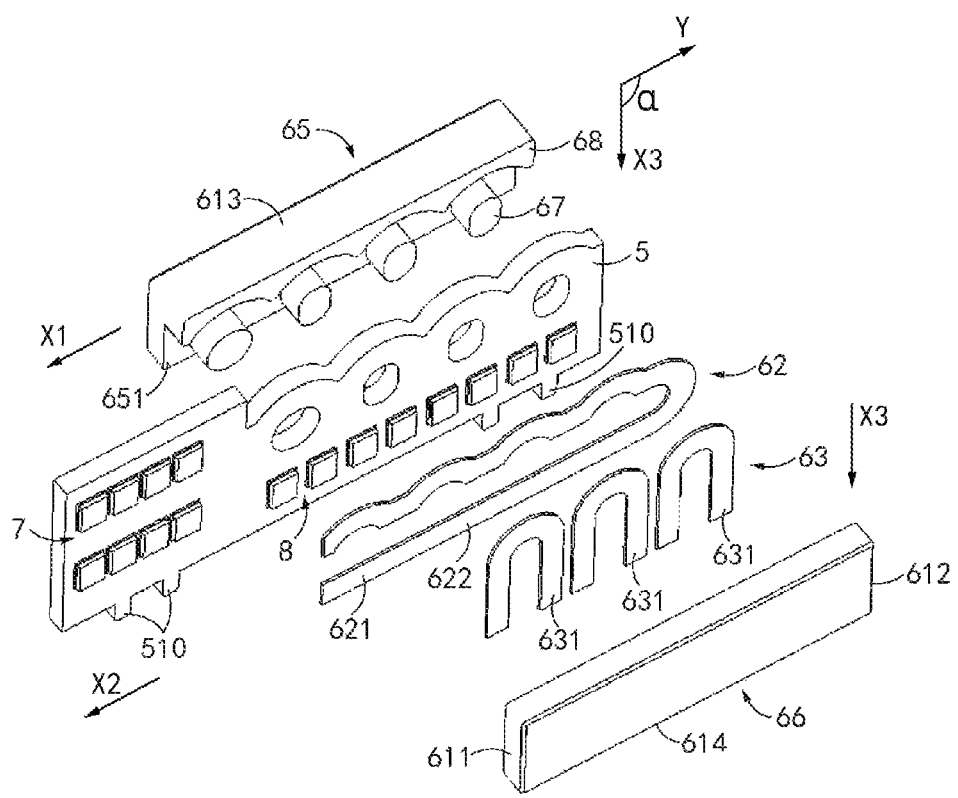
FIG. 3 is an exploded perspective diagram of the power module as shown in FIG. 2.

FIG. 2 is a schematic diagram of the power module according to an exemplary embodiment of the present disclosure; FIG. 3 is an exploded perspective diagram of the power module as shown in FIG. 2. Referring to FIGS. 2 and 3, a power module 500 includes a PCB 5, a magnetic element, a primary winding circuit 7 and at least one secondary winding circuit 8.

The PCB 5 is divided into two regions, wherein the magnetic element and the secondary winding circuit 8 are provided on one region of the PCB 5, and the primary winding circuit 7 is provided on the other region of the PCB 5. For example, as shown in FIGS. 2, 3, the primary winding circuit 7 is located on left side region of the PCB 5, the magnetic element and secondary winding circuit 8 are located on right side region of the PCB 5, and may be arranged in an upper row and a lower row. Certainly, the present disclosure is not limited thereto, the magnetic element, the primary winding circuit and the secondary winding circuit may also have other arrangements on the PCB.

The magnetic element is provided on the PCB 5 and includes a core structure 61, a primary winding 62 and at least one secondary winding 63.

The core structure 61 of the magnetic element presents in a shape of strip and has a first side 611, a second side 612 opposite to the first side 611, a third side 613 and a fourth side 614 opposite to the third side 613. The third side 613 and the fourth side 614 are connected with the first side 611 and the second side 612, respectively. The first side 611, the second side 612, the third side 613 and the fourth side 614 may together form a shape of rectangle. In addition, the third side 613 and the fourth side 614 may be surfaces extending along the length direction of the core structure 61, respectively.

The primary winding circuit 7 is coupled with the primary winding 62 of the magnetic element. The primary winding circuit 7 is positioned on the PCB 5 in the vicinity of the first side 611 of the core structure 61. In other words, the primary winding circuit 7 is located on left side of the magnetic element.

The secondary winding circuit 8 is coupled with at least one secondary winding 63 of the magnetic element, respectively. The secondary winding circuit 8 is positioned on the PCB 5 in the vicinity of the fourth side 614 of the core structure 61. In other words, the secondary winding circuit 8 is located under the magnetic element.

With the arrangement of the magnetic element, the primary winding circuit 7 and the secondary winding circuit 8 on the PCB 5, the cooling air from the left side of the power module may cool all of the magnetic element, the primary winding circuit 7 and the secondary winding circuit 8 smoothly, so that the power module has an excellent heat dissipation effect.

It should be noted that the above description of the magnetic element, the primary winding circuit and the secondary winding circuit on the PCB is exemplary, and may not be construed as a limitation of the present disclosure. As should be appreciated by those skilled in the art, the arrangement of the magnetic element, the primary winding circuit and the secondary winding circuit on the PCB may be in other manners. For example, the primary winding circuit 7 is optionally positioned in the vicinity of the first side 611 or the second side 612, and the secondary winding circuit 8 is optionally positioned in the vicinity of the third side 613 or the fourth side 614.

Figure 4:
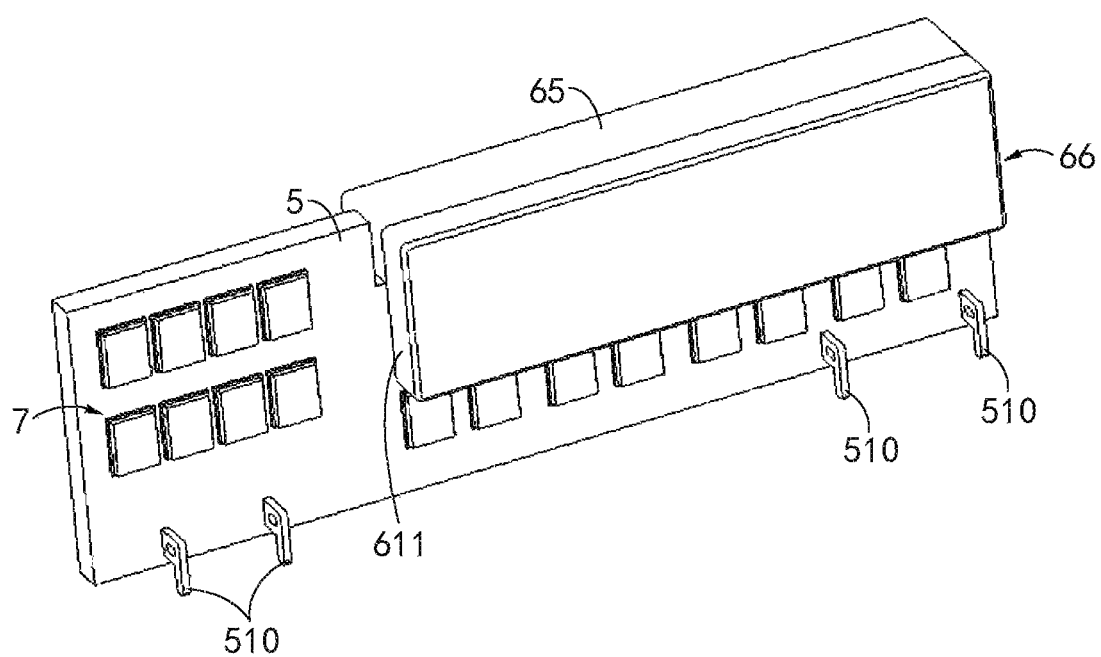
FIG. 4 is a schematic diagram of the power module according to another exemplary embodiment of the present disclosure.
Figure 5:
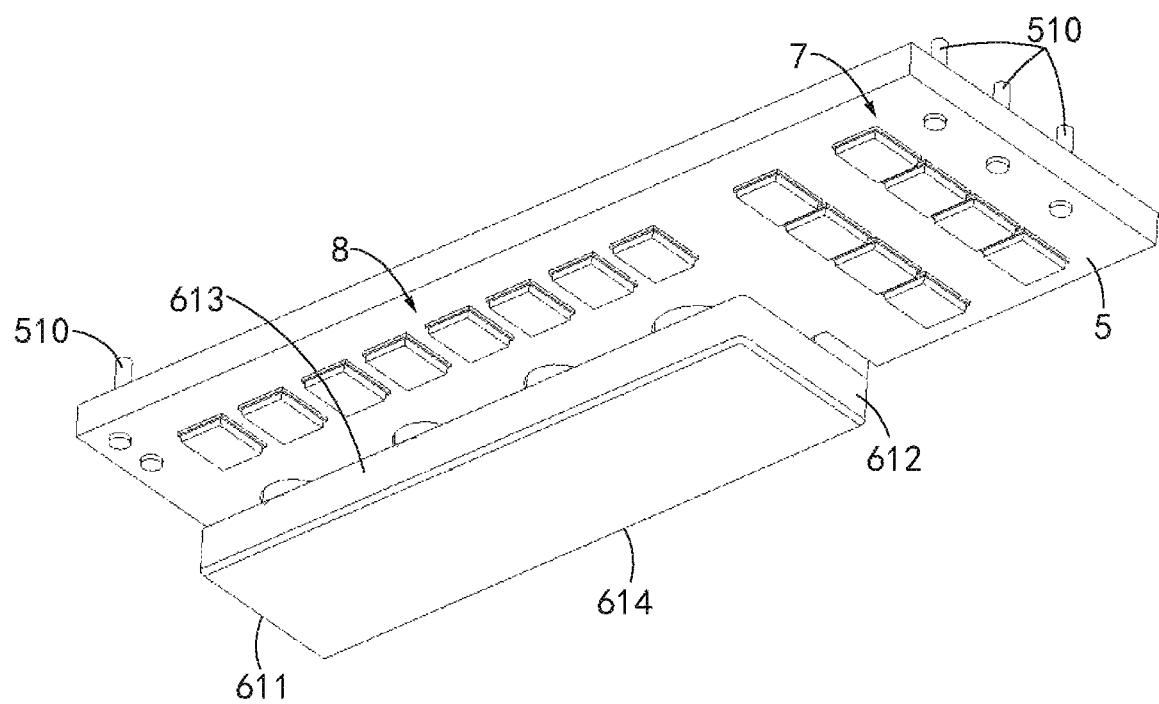
FIG. 5 is a schematic diagram of the power module according to another exemplary embodiment of the present disclosure.

Besides, the power module further includes pins 510, which are configured to realize the electrical connection and fixation between the power module and the main board. As shown in FIG. 2, the pins 510 are provided under the PCB 5, and the pin 510 may be parallel with the PCB 5, or may be provided on the same surface with the PCB 5. In an embodiment, the pin 510 may be formed integrally together with the PCB 5. As shown in FIG. 2, the pins 510 may be electrically connected with the main board via a PCB winding. In another embodiment, the pins 510 may be made of metal material, which electrically connects with the main board using its own metal conductivity characteristic, as shown in FIG. 4. In another embodiment, the pins 510 may be positioned at a place as shown in FIG. 5, the pins 510 may be perpendicular to the PCB 5. However the present disclosure in not limited thereto, the position of the pins 510 may be adjusted according to the actual requirements.

The primary winding circuit 7 may include at least one switch 71, which is in the vicinity of the first side 611 or the second side 612 of the core structure 61. When the primary winding circuit 7 includes a plurality of switches 71, those switches 71 may be arranged in two rows parallel with each other, wherein each row may be arranged along the length direction of the core structure 61 (see FIG. 2). In other embodiments, each row of the switches 71 may be arranged perpendicular to the length direction of the core structure 61 (see FIG. 5). In another embodiment, each row of the switches 71 may form an angle with a length direction of the core structure 61 (not shown in Figures). Certainly, the present disclosure in not limited thereto, a plurality of switches 71 forming the primary winding circuit 7 may be arranged in other manners, such as arranging in three rows or four rows, or arranging in a shape of circle, etc.

The secondary winding circuit 8 may include at least one switch 81. When the secondary winding circuit 8 includes a plurality of switches 81, those switches 81 may arranged along the length direction of the core structure 61. As shown in FIG. 2, the switches 81 may be positioned in the vicinity of the fourth side 614 of the core structure 61, that is, the switches 81 may be positioned under the core structure 61. Thus, the lead direction of the secondary winding 63 along the direction from the top to the bottom may be directly and electrically connected with the secondary winding circuit 8 without being bent. Furthermore, because of the significant reduction of the electrical path and line loss in the secondary winding, the efficiency of the power module and the power device may be improved. Certainly, the present disclosure is not limited thereto, the switches 81 of the secondary winding circuit 8 may be alternatively positioned in the vicinity of the third side 613 (see FIG. 5). The switches 81 forming the secondary winding circuit 8 may not be necessarily arranged in one row along the length direction of the core structure 61. Those switches 81 may also be arranged in other manners. For example, those switches 81 may be arranged in two rows (not shown). Furthermore, the switches 81 in two rows may be in a pair-wise alignment, or in a staggered arrangement, etc.

The arrangement of the switches 71 forming the primary winding circuit 7 and the arrangement of the switches 81 forming the secondary winding circuit 8 may be any combination two-by-two, thus various arrangements may be formed by the core structure 61, the primary winding circuit 7 and the secondary winding circuit 8. The number and connection manners of the primary winding circuit 7 and the secondary winding circuit 8 may not be limited. For example, in some embodiments, the output terminals of the secondary winding circuits 8 may be connected in parallel.

Figure 6:
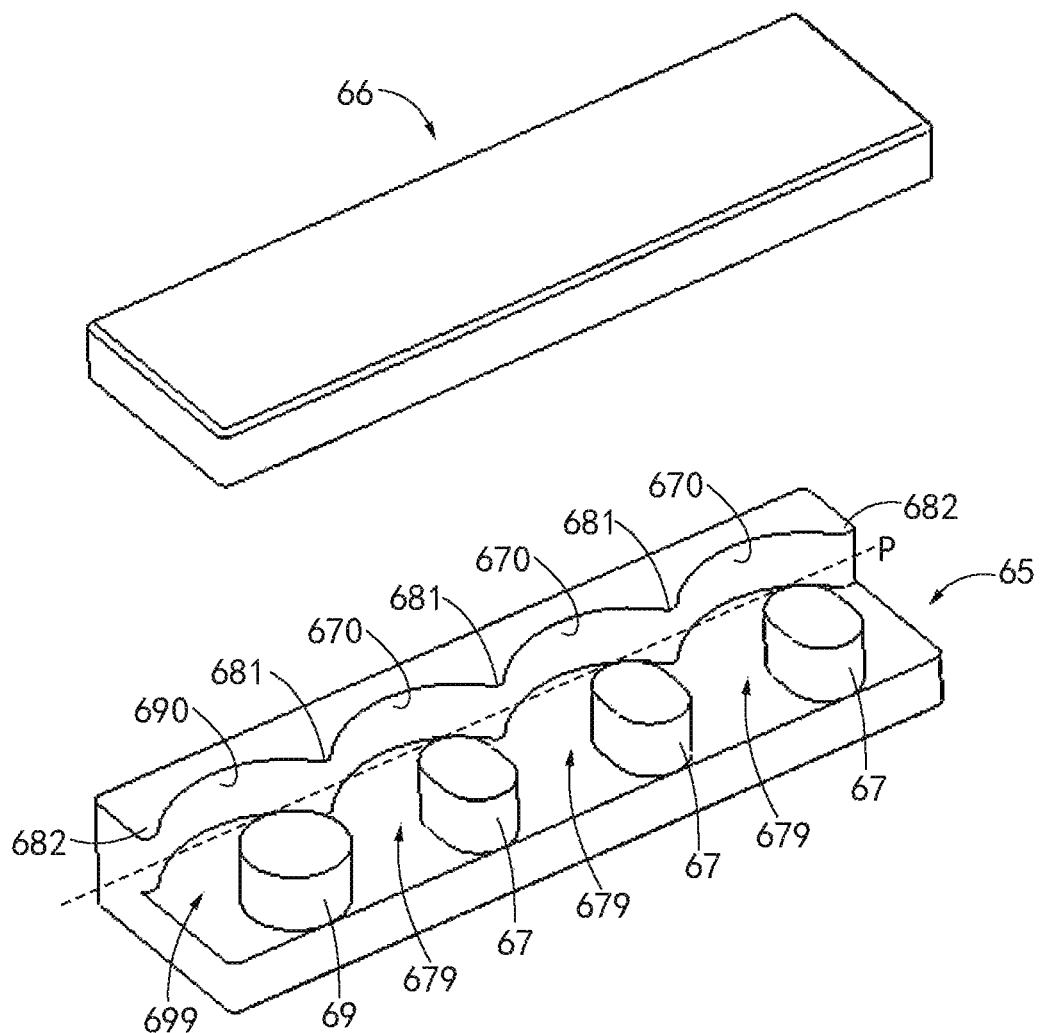
FIG. 6 is an exploded perspective diagram of the core structure of the power module according to an exemplary embodiment of the present disclosure.

FIG. 6 shows the perspective diagram of the core structure 61. Referring to FIGS. 2, 3, 6, the core structure 61 of the magnetic element may include a first magnetic cover 65, a second magnetic cover 66, four winding poles and a common side pole 68. The number of the winding pole may not be limited to four, and the number of the winding poles may be increased or decreased according to factors such as volume size of the core structure 61 in practical application.

The first magnetic cover 65 has a first surface 651, which may connect with the second magnetic cover 66 (see FIG. 3).

In an exemplary embodiment, all of four winding poles and one common side pole 68 may be formed on the first magnetic cover 65. It will be understood by those skilled in the art that, the present disclosure is not limited thereto. In other exemplary embodiment, the winding poles and the common side pole 68 may also be formed on the second magnetic cover 66 or one of the winding poles and common side pole 68 may be formed on the first magnetic cover 65, and the rest may be formed on the second magnetic cover 66.

The four winding poles may be provided between the first magnetic cover 65 and the second magnetic cover 66, and are located on side of the first surface 651. One or more of the winding poles may be inductor magnetic pole, which may be used for an inductor winding, and other winding poles may be transformer magnetic pole, which may be used for a primary winding 62 and secondary winding 63 wound thereon.

As shown in FIG. 6, one winding pole is an inductor magnetic pole 69, which has a cross-section shape of circle, and the other three winding poles are transformer magnetic pole 67, each of which has a cross-section shape of oval. The transformer magnetic pole 67 and the inductor magnetic pole 69 may have the same cross-section shape or the different cross-section shapes.

The common side pole 68 is provided between the first magnetic cover 65 and the second magnetic cover 66, and positioned on the other side of the first surface 651, opposite to the transformer magnetic pole 67 and the inductor magnetic pole 69.

A plurality of first protrusions 681 may be provided on the side surface of the common side pole 68 towards four winding poles, which extend towards the gap formed between the inductor magnetic pole 69 and the transformer magnetic pole 67, respectively. In one embodiment, the first protrusion 681 extends to or beyond a virtual surface P. The virtual surface P is defined as a surface connecting with side walls of the inductor magnetic pole 69 and the transformer magnetic pole 67 towards the common side pole 68. The side surface of the common side pole 68 towards the inductor magnetic pole 69 and the transformer magnetic pole 67 includes four curved surfaces corresponding to the inductor magnetic pole 69 and the transformer magnetic pole 67 respectively. Each of the four curved surfaces protrudes in a direction away from the corresponding winding pole. More specifically, the curved surfaces 690 corresponding to the inductor magnetic pole 69 protrude in a direction away from the inductor magnetic pole 69, and the curved surfaces 670 corresponding to the transformer magnetic pole 67 protrude in a direction away from the transformer magnetic pole 67. That is to say, the curved surface may be partially surrounding the magnetic pole. The first protrusion 681 may be formed at the connection position of four curved surfaces 690, 670. In an embodiment, the first protrusion 681 may support the core so as to maintain the air gap of the inductor or the transformer stable and to keep consistent inductance value.

The curved surface of the common side pole 68 has a projection on the first magnetic cover 65, and the projection presents a shape of circular, partial elliptical or partial runway. As shown in FIG. 6, four curved surfaces 690, 670 of the common side pole 68 have the same shape. In other embodiment, multiple curved surfaces of the common side pole 68 may be various.

In an embodiment, the curved surface of the common side pole 68 has a shape corresponding to that of the winding pole, for example, the inductor magnetic pole 69 has a cross-section of circle, and accordingly the curved surface 690 of the inductor magnetic pole 69 has a shape of partial circular arc see FIG. 6); The transformer magnetic pole 67 has a cross-section of oval, and accordingly the curved surface 670 of the transformer magnetic pole 67 has a shape of circular arc surface. However the present disclosure is not limited thereto, the curved surface of the common side pole 68 may has a shape not compatible with that of cross-section of the winding pole. For example, the winding pole has a cross-section of circular, while the curved surface has a shape of runway.

A holding space 699 is defined between the curved surface 690 of the common side pole 68 and corresponding inductor magnetic pole 69, which may use for disposing the inductor winding; A holding space 679 is defined between the curved surface 670 of the common side pole 68 corresponding transformer magnetic pole 67, which may be used for disposing the transformer winding.

In other embodiment, second protrusions 682 are provided at two ends of the common side pole 68 respectively. And the second protrusions 682 may be corresponding to two ends of the first magnetic cover 65 and may extend along the same direction as that of the first protrusion 681.

In an embodiment as shown in FIG. 6, the first magnetic cover 1, the inductor magnetic pole 69, the transformer magnetic pole 67 and the common side pole 68 may collectively constitute a special E-type magnetic core, and the second magnetic cover 66 may be an I-type magnetic core, thus forming an EI-type core structure by assembling the first magnetic cover 65 and the second magnetic cover 66. It is to be appreciated that the core structure according to present disclosure is not limited to EI-type core structure. For example, the core structure may also be an EE-type core structure and so on.

The structure of the magnetic element will be briefly described combining the inductor winding 621, the primary winding 622 and the secondary winding 63 as follows.

Figure 7:
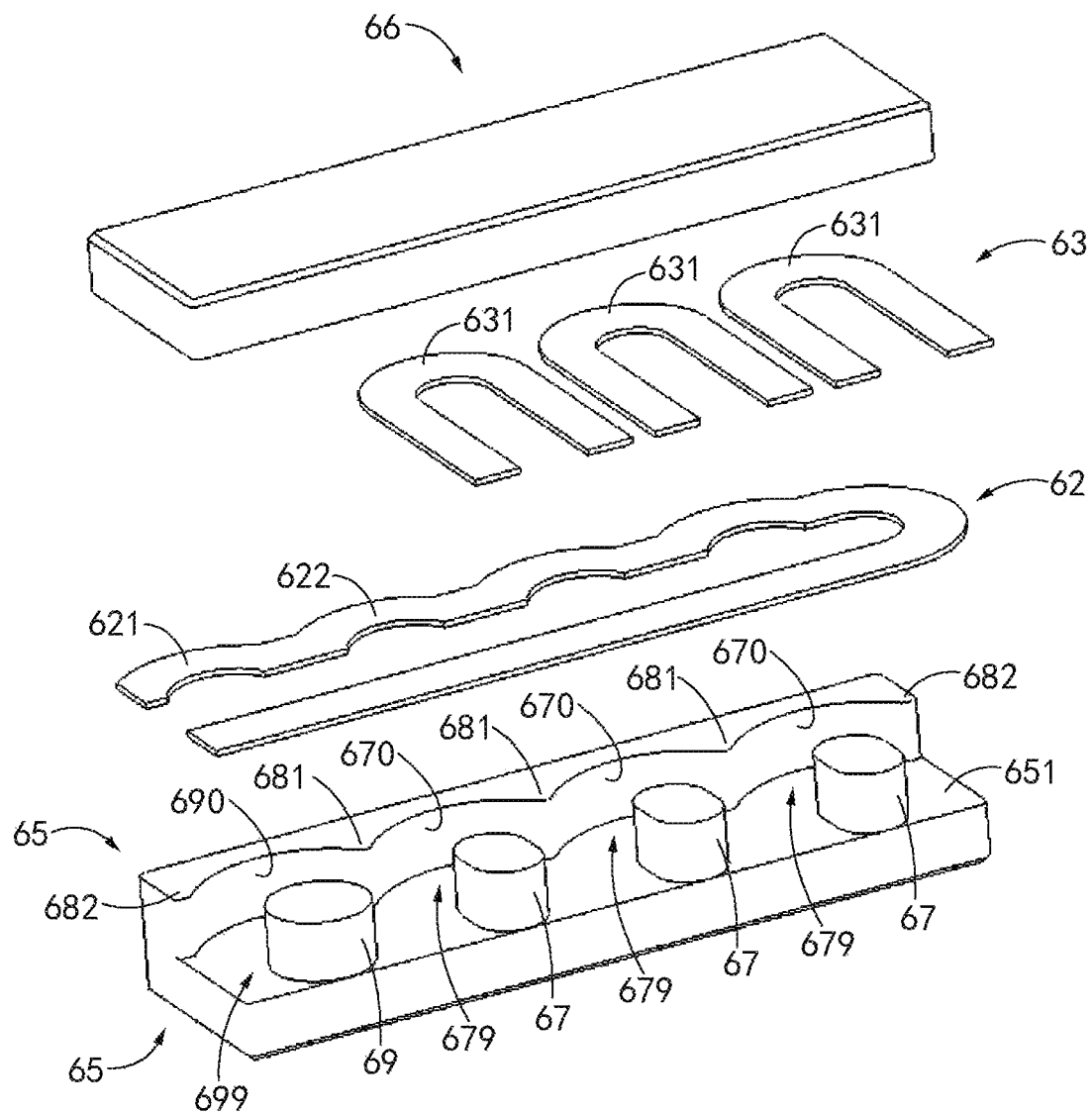
FIG. 7 is an exploded perspective diagram of the magnetic element of the power module according to an exemplary embodiment of the present disclosure.

FIG. 7 is an exploded perspective diagram of the magnetic element of the power module, which shows the winding manner of the primary winding 622 and secondary winding 63 on the transformer magnetic pole 67. As shown in FIGS. 3, 7, the inductor winding 621 and primary winding 622 may be formed totally by one piece of wire, which may wound around four winding poles, that is, the wire may encircle all of the winding poles. A part of the wire corresponding to the inductor magnetic pole 69 may form the inductor winding 621, and other part of the wire corresponding to the transformer magnetic pole 67 may form the transformer winding 622. The lead direction of the wire formed the inductor winding 621 and the primary winding 622 may be along the arrangement direction of four transformer magnetic poles 67, that is, along the length direction of the core structure 61. It is very convenient for the wire directly extending from the first side 611 of the core structure 61. Referring to FIG. 3, under such condition, and the outgoing line of the primary winding 622 may be coupled with the primary winding circuit 7 which is positioned in the vicinity of the first side 611. Thus, the electrical path between the primary winding 622 and the primary winding circuit 7 may be relatively short. The previous description of the primary winding 622 and its lead direction may be exemplary and not limited to present disclosure.

The winding 63 may include three pieces of wire sections 631, each of which is wounded around one of the transformer magnetic poles 67. The lead direction of the three wire sections may be far away from the common side pole 68, and may be perpendicular to the length of the common side pole 68. In present exemplary embodiment, the length direction of the common side pole 68 may be coincident with the length direction of the core structure 61. Referring to FIG. 3, the outgoing lines of the three wire sections 631 of the secondary winding 63 (the outgoing lines of the secondary winding 63) may directly extend from the fourth side 614 of the core structure 61, which is very convenient. The outgoing lines of the secondary winding 63 may be in the vicinity of the secondary winding circuit 8, and the pins 510 of the PCB 5 may be positioned under the core structure 61 and may be in the vicinity of the secondary winding circuit 8. Therefore, the electrical path may be shorten and line losses of the secondary winding circuit may be reduced according to the present disclosure.

The previous description of the primary winding 622, the secondary winding 63 and their outgoing lines are exemplary rather than a limiting to present disclosure. The secondary winding 63 may be other structure. For example, the secondary winding 63 may include two, five or more section wires, or the secondary winding 63 may be formed by conductive sheet. The lead direction the outgoing lines of the three wire sections may form an angle of 45°~135° with the length direction of the common side pole 68 such as 45°, 60°, 100°, 120°, 135°, etc.

The wire of the primary winding 622 or the wire of the secondary winding 63 may be an enameled-wire or a PCB winding formed in the PCB 5.

Power Device

Figure 8:
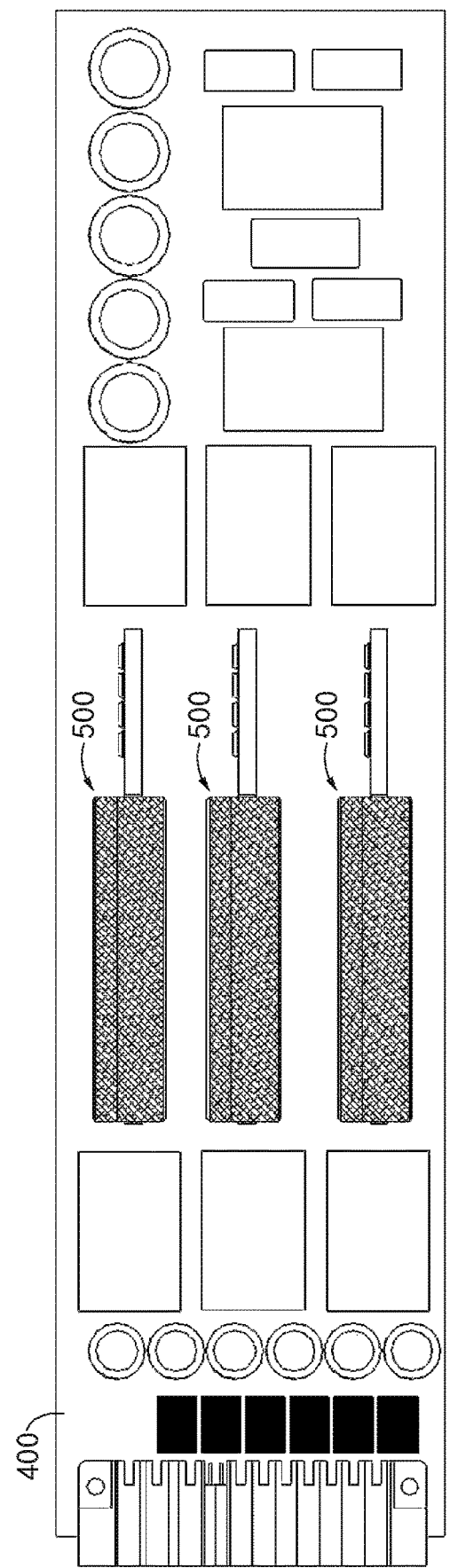
FIG. 8 is a schematic diagram of the power device according to an exemplary embodiment of the present disclosure.

Referring to FIG. 8, FIG. 8 is a schematic diagram of the power device according to an exemplary embodiment of the present disclosure. As shown in FIG. 8, the power device may include a main board 400 and at least one power module 500. The main power semiconductor component of the power device may be integrated together into the power module 500. FIG. 8 shows three power modules 500. However, the number of the power modules 500 may increase or decrease according to actual requirement. In the present embodiment, the power module 500 may be a power module as shown in FIG. 2. The power module 500 has a plurality of pins 510, which may be parallel with the PCB (referring to FIG. 2). The main board 400 is provided with holes (not shown) for which the pins 510 may insert in. The power module 500 may achieve electrical connection and fixation with the main board 400 via the pins 510 and the holes.

Figure 9:
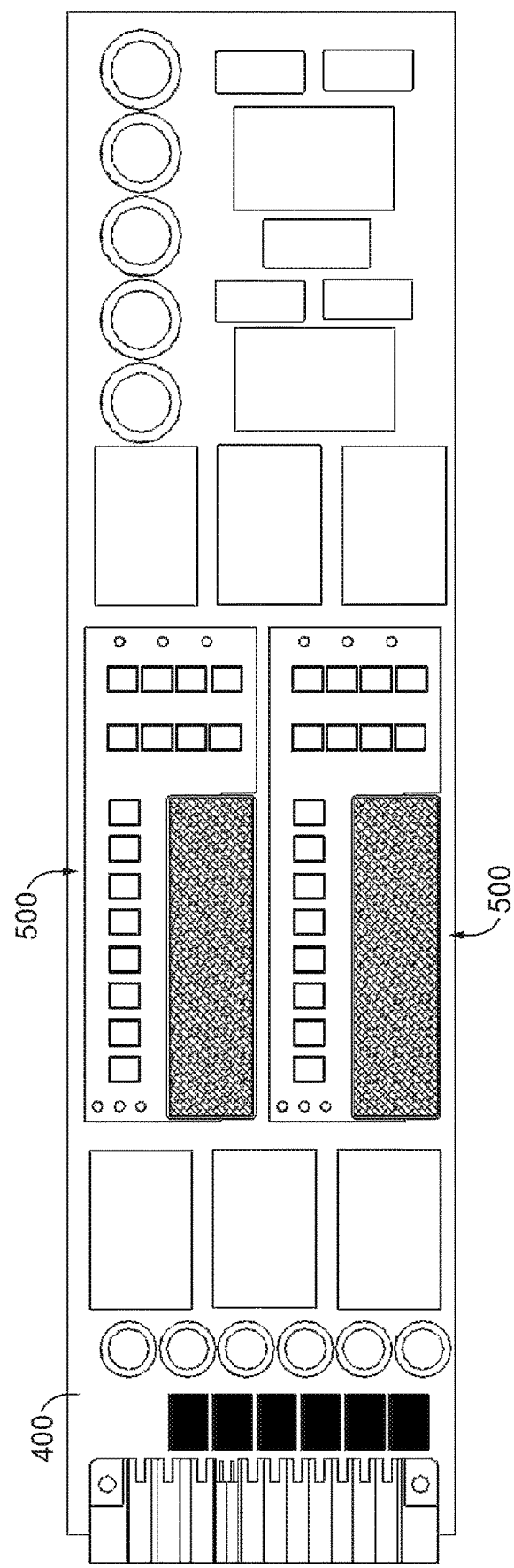
FIG. 9 is a schematic diagram of the power device according to another exemplary embodiment of the present disclosure.

Referring to FIG. 9, FIG. 9 is a schematic diagram of the power device according to another exemplary embodiment. As shown in FIG. 9, the power device may include a main board 400 and at least one power module 500. The main power semiconductor component of the power device may be integrated together into the power module 500. FIG. 9 shows two power modules 500. However, the number of the power modules 500 may increase or decrease according to actual requirement. In the present embodiment, the power module 500 may be a power module as shown in FIG. 5. The power module 500 has a plurality of pins 510, which may be perpendicular to the PCB (Referring to FIG. 4). The main board 400 is provided with holes (not shown) for which the pins 510 may insert in. The power module 500 may achieve electrical connection and fixation with the main board 400 via the pins 510 and the holes.

It should be understood, the previous description of the pins may be formed integrally with the PCB. The pins may be a metal pin, but the present disclosure is not limited thereto, determination may depend upon actual requirement.

In the present power module, the core structure of the magnetic element has a first side and a second side opposite to each other, and a third side and a fourth side opposite to each other. The primary winding circuit is positioned in the vicinity of the first side or the second side, the secondary winding circuit is positioned in the vicinity of the third side or the fourth side. That is, the primary winding circuit and the secondary winding circuit are each positioned in the vicinity of two adjacent sides of the core structure, such arrangement is suitable for an architecture that the primary windings are connected in series and the secondary windings are connected in parallel.

The lead direction of the secondary winding in this magnetic element may be easily designed to be oriented towards the secondary winding circuit, which may be directly connected with the secondary winding circuit without being bent, resulting in a significant reduction of the electrical path and line loss in the secondary winding, thereby the efficiency of the power module and the power device may be improved.

Because the primary winding circuit and the secondary winding circuit are each positioned in the vicinity of two adjacent sides of the core structure, and the core structure does not obstruct the secondary winding circuit, thus the cooling air can cool all of the primary winding circuit, the secondary winding circuit and the magnetic element, and the cooling blind corner may be avoided. Therefore, the power module and the power device according to present disclosure have an excellent heat dissipation effect.

The exemplary embodiments of the disclosure has been shown and described above. It should be understood that the disclosure would never be limited to the disclosed embodiments, rather, the present disclosure is intended to cover various modification and equivalent arrangement fallen within spirit and scope of the attached claims.

What is claimed is:

1. A power module, comprising:
   a printed circuit board (PCB);
   a magnetic element, disposed on the PCB, wherein the magnetic element comprises a core structure, a primary winding and at least one secondary winding, and the core structure has a first side, a second side, a third side and a fourth side, wherein the second side is opposite to the first side, the fourth side is opposite to the third side, wherein the third side is contacted between the first side and the second side, the fourth side is contacted between the first side and the second side;
   a primary winding circuit, wherein the primary winding circuit is disposed on the PCB and positioned in the vicinity of the first side or the second side of the core structure; and
   at least one secondary winding circuit, wherein the secondary winding circuit is disposed on the PCB and positioned in the vicinity of the third side or the fourth side of the core structure,
   wherein, the secondary winding circuit is disposed at a side of the third side of the core structure or at a side of the fourth side of the core structure, and the primary winding circuit is disposed at a side of the first side of the core structure or at a side of the second side of the core structure.

2. The power module according to claim 1, wherein the PCB is divided into two regions, wherein the magnetic element and the secondary winding circuit are provided on one region of the PCB, and the primary winding circuit is provided on the other region of the PCB.

3. The power module according to claim 1, wherein the power module comprises a plurality of secondary winding circuits, and the output terminals of each of the plurality of secondary winding circuits are coupled with each other in parallel.

4. The power module according to claim 1, wherein the core structure of the magnetic element presents in a shape of strip, and the third side and the fourth side are extended along the length direction of the core structure.

5. The power module according to claim 4, wherein the secondary winding circuit comprises at least one switch, which is arranged along the length direction of the core structure.

6. The power module according to claim 1, wherein the power module further comprises at least one pin which is parallel with or perpendicular to the PCB.

7. The power module according to claim 6, wherein the pin is made of metal material.

8. The power module according to claim 6, wherein the pin is formed integrally together with the PCB.

9. The power module according to claim 1, wherein the core structure of the magnetic element comprises:
   a first magnetic cover and a second magnetic cover; and
   at least two winding poles and at least one common side pole, which are provided between the first magnetic cover and the second magnetic cover, and the winding poles are opposite to the common side pole, and the side wall of the common side pole towards the two winding poles has at least one first protrusion extending along the direction of a gap between two adjacent winding poles.

10. The power module according to claim 9, wherein the secondary winding circuit is disposed in the vicinity of the third side or the fourth side of the winding poles.

11. The power module according to claim 9, wherein the primary winding is formed totally by one piece of wire wounded around all of the winding poles.

12. The power module according to claim 11, wherein a lead direction of the wire of the primary winding is consistent with an arrangement direction of the winding poles.

13. The power module according to claim 9, further comprising a plurality of secondary windings, each of which has a lead direction far away from the common side pole, an angle α of 45°~135° is formed between a length direction of the common side pole and the lead direction of the secondary winding.

14. A power device, comprising:
    a main board;
    at least one power module according to claim 1, which is inserted in the main board, respectively.

15. The power device according to claim 14, wherein the power module comprises at least one pin which is parallel with the PCB; the main board comprises at least one hole, the pin of the power module is perpendicularly inserted in the hole of the main board.

16. The power device according to claim 14, wherein the power module comprises at least one pin which is perpendicular to the PCB; the main board comprises at least one hole, the pin of the power module is perpendicularly inserted in the hole of the main board.

* * * * *